July 5, 1955 G. W. CARTER 2,712,599

AUTOMATIC GAIN CONTROL FOR REMOTE CUT OFF TUBE

Filed June 27, 1951

GEORGE W. CARTER
*INVENTOR.*

BY

Killman and Kerst
*ATTORNEYS*

United States Patent Office 2,712,599

Patented July 5, 1955

2,712,599

AUTOMATIC GAIN CONTROL FOR REMOTE CUT OFF TUBE

George W. Carter, Towson, Md., assignor to Bendix Aviation Corporation, Towson, Md., a corporation of Delaware Application June 27, 1951, Serial No. 233,791

9 Claims. (Cl. 250—20)

Figures 1, 2:
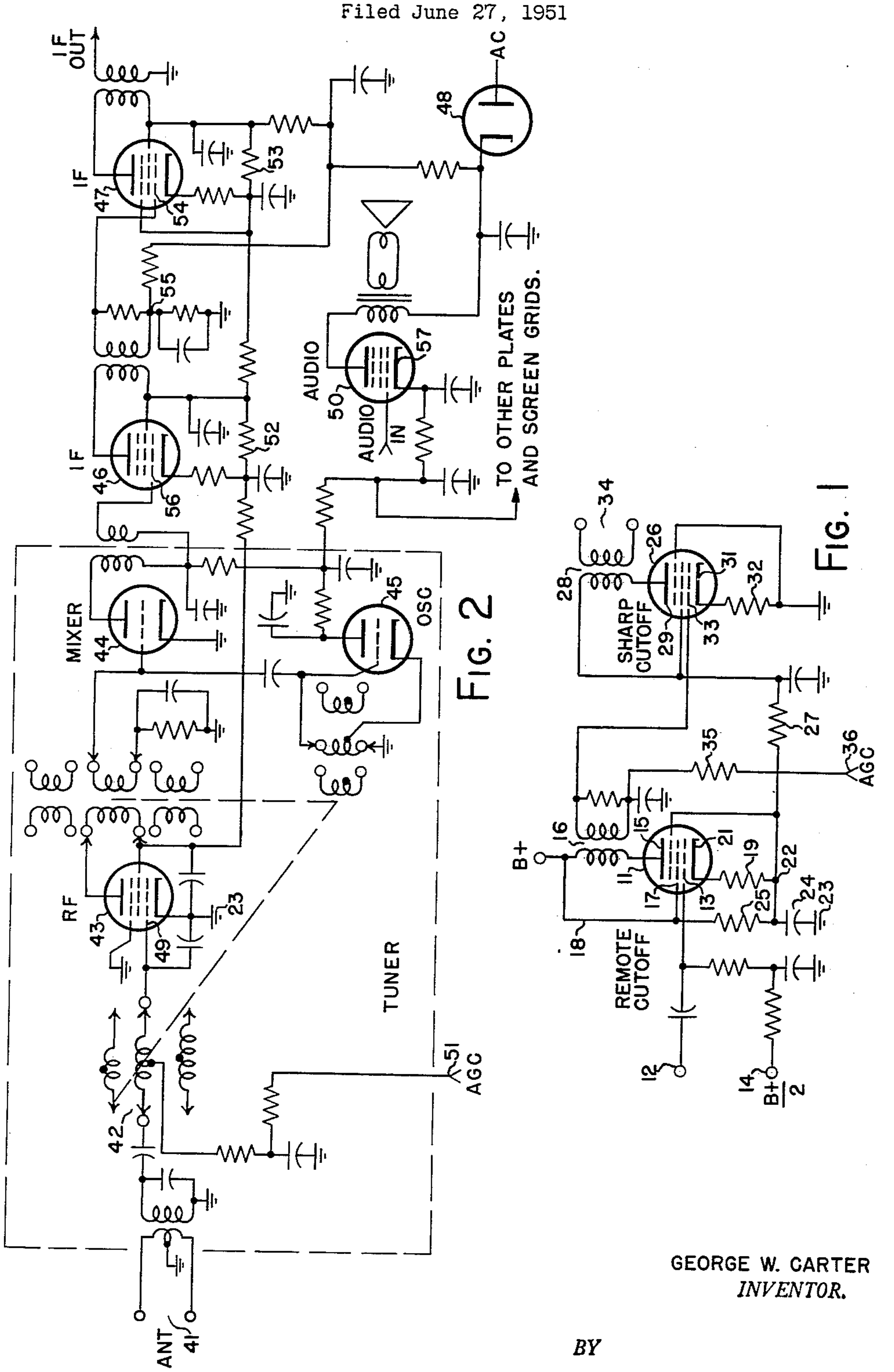

This invention relates generally to automatic gain control (AGC) circuits and more particularly to improved series circuits for providing gain control over wide ranges of signal strength in an amplifier without introducing distortion or other undesirable effects.

In prior art devices employing automatic gain control such, for example, as television receivers the control voltage available for gain control purposes has not been sufficient to provide the desired range of control using remote cutoff type tubes. In such cases the use of sharp cutoff tubes has been resorted to to provide the required range of control. The characteristic of sharp cutoff tubes is such that in AGC operation severe distortion of the signal modulation envelope cannot be avoided for high level gain reduction. This distortion in the R. F. amplifier results in cross-modulation with strong signals in adjacent channels and in I. F. amplifiers clipping of the synchronizing or other peak signals as well as other undesirable effects.

The present invention provides new and improved gain control characteristics by means of circuits in which remote cutoff tubes are controlled over their entire characteristic by means of a series connection for D. C. currents with a sharp cutoff tube. The AGC signal is applied to the sharp cutoff tube and produces an amplified control signal to the remote cutoff tubes, thereby effecting their full range of control from a value of AGC signal much smaller than would be required for obtaining the same amount of control by direct application to the remote type tubes. The full range of control is achieved without introducing any of the aforementioned distortion effects by providing an auxiliary current path to the sharp cutoff tube, whereby it always operates in a suitable region although the remote cutoff tubes are operating with an extremely small plate current.

It is, accordingly, an object of this invention to provide a new and improved series circuit automatic gain controlled amplifier.

A further object of this invention is to provide a series amplifier circuit in which tubes having different gain control characteristics are employed to produce improved operation.

Another object is to provide the uniform AGC operational characteristics of remote cutoff tubes in a circuit which has available only control potentials sufficient to control a sharp cutoff type tube, and is free from distortion effects due to AGC action.

Another object of this invention is to provide in a heterodyne-type receiver a series AGC circuit which includes both radio frequency and intermediate frequency amplifier stages.

Another object is to provide a R. F.—I. F. series AGC circuit having a regulated reference potential for the AGC potential.

It is a further object to provide an improved series amplifier employing AGC which is simple and economical to manufacture and which provides efficient utilization of the power required by the circuit.

These and other objects of the present invention will be better understood when considered with reference to the following detailed description and the accompanying drawings wherein:

Fig. 1 is a schematic diagram of a two-stage amplifier embodying the invention; and Fig. 2 is a partial schematic diagram of a television receiver employing the invention.

Referring to Fig. 1 there is shown an amplifier circuit having as a first stage, a remote cutoff pentode 11 having an input circuit 12 coupled to a control grid 13. The control grid 13 is biased by a D. C. connection to a suitable bias terminal 14. A positive voltage (B+) is supplied to plate 15 through one winding of transformer 16. The D. C. voltage for screen grid 17 is derived from the B+ supply via a conductor 18. A resistor 19 connects cathode 21 with intermediate point 22 which is by-passed to ground 23 by capacitor 24. A shunt path around tube 11 from the B+ supply to the point 22 is provided by the lead 18 and a resistor 25 serially connected therebetween.

The D. C. path for the second stage of the amplifier comprising a sharp cutoff type tube 26 is in series circuit with the shunt combination of tube 11 and resistor 25. The supply path from the point 22 is through a decoupling resistor 27 and one winding of a transformer 28 to plate 29 of the tube 26. The D. C. path is completed from the plate 29 to cathode 31 and through a resistor 32 to ground.

The signal circuit through the amplifier is from the input circuit 12 to the transformer 16 in the plate circuit of tube 11. Signals in the transformer 16 are coupled to grid 33 of tube 26 and appear in the transformer 28, wherein they are coupled to an output circuit 34. The gain controlling potential for the amplifier is derived in any conventional manner and applied to the grid 33 through one winding of the transformer 16 and a resistor 35, via AGC input terminal 36.

The operation of the circuit of Fig. 1 provides a variation of potential at the plate 29 of tube 26 which is larger than the variation of AGC voltage applied at the AGC input terminal 36 due to the amplifier action of tube 26 operating with a D. C. plate load comprising primarily the resistance of the parallel combination of resistor 25 and tube 11. This D. C. variation appears on the cathode 21 and is effective as a gain controlling signal of the same sense as the AGC voltage acting on the grid 33. There is thus provided an AGC control characteristic of the amplifier which is uniform and has the other desirable properties usually associated with remote cutoff tubes without requiring a variation in AGC voltage greater than the normal bias values between zero and cutoff for a sharp cutoff tube. The undistorted operation of the amplifier is continuous for all values of AGC potential from zero to a large value where tube 11 is very nearly cutoff because grid 13 is never positive and the tube 26, at all times, functions in a region of its characteristic where normal amplifying action obtains. Thus, the invention provides optimized performance of amplifiers in quantity production with undistorted amplification of the full range of signal levels as follows: signals producing little, if any, AGC voltage wherein both tubes 11 and 26 are operated near their maximum ratings and the presence of resistor 25 permits tube 11 to be initially biased from bias source 14 at a relatively more negative level (i. e. less current than tube 26) such that for the production variations encountered in such circuits grid 13 will never assume a positive potential; signals producing a large AGC voltage, wherein tube 26 operates due to resistor 25 at a current level at which it is capable of handling relatively large signals from tube 11 even though tube 11 is operating near cutoff with a maximum reduction in gain; and all signals intermediate these extreme values.

These advantages may be realized over a somewhat limited signal range together with the advantage of remote cutoff tube performance in response to a small available AGC voltage by omitting resistor 25 from the circuit of Fig. 1. Such an arrangement will provide the remote cutoff characteristic hereinbefore described for a smaller range of input signals and will provide satisfactory operation in this range as follows. At low AGC levels the plate and screen potentials of tube 11 may be adjusted iniitally to a higher relative level to permit grid 13 to be biased at a more negative level to obtain the optimized operating value of series plate current and thereby reduce the probabilities of positive operation of grid 13. At high AGC levels a major reduction in gain is effected with a uniform remote cutoff characteristic by the stage including tube 11 before distortion occurs in tube 26.

Fig. 2 shows the circuit of the present invention in a series tube circuit which embraces diverse frequencies of operation in at least two of the controlled stages, such as a television receiver. The signal circuit proceeds from an antenna input circuit 41 through a selective tuning means 42 to a sharp cutoff R. F. amplifier 43. The signal is heterodyned in a mixer 44 with a frequency from an oscillator 45 to produce an intermediate frequency signal. The I. F. signal is further amplified by remote cutoff I. F. amplifiers 46 and 47 and is further utilized in a conventional manner to obtain picture signals and audio signals, the latter being applied to an audio output amplifier 50.

The D. C. supply for the R. F.-I. F. amplifiers is obtained from a rectifier circuit 48 and the direct path for current flow is from the rectifier supply 48 serially through the plate impedance and the anode-cathode discharge path of amplifiers 47, 46 and 43 to ground 23 in that order. An AGC potential is supplied to control grid 49 of amplifier 43 from the AGC terminal 51. Resistors 52 and 53 provide shunt paths around the anode-cathode discharge paths of amplifiers 46 and 47 respectively, if desired, as hereinbefore described. The D. C. potential of grid 54 is maintained at a proper level by means of a voltage divider 55 energized from the D. C. source 48. Control grid 56 of amplifier 46 is maintained at a regulated D. C. potential by connection, through suitable by-pass and filter elements, to the cathode 57 of the audio amplifier 50. The cathode 57 maintains itself at a substantially constant potential by self-regulatory action in supplying current to the oscillator 45, mixer 44 and plate and screen grid circuits of other tubes and the like, not shown.

In operation the circuit of Fig. 2 provides economies of power consumption together with ease of manufacture in that the series D. C. circuit operates from the D. C. supply without series dropping resistors and the improved gain control circuit permits wider circuit tolerances without any danger of impaired operation. The improved remote cutoff control characteristic of the series circuit as described in relation to the circuit of Fig. 1 is also provided in the circuit of Fig. 2 in which the tubes are arranged to provide optimum performance with diverse frequencies of the operating signals. The operation of the remote cutoff amplifier 46 at the intermediate frequency is much more satisfactory than if such characteristic were attempted to be obtained at the higher radio frequencies and therefore the first I. F. stage 46 provides the lowest signal level point in this circuit for satisfactory realization of remote cutoff in accordance with principles well known in the art. The sharp cutoff stage 43 is biased with respect to ground 23 and provides series current control in accordance with the AGC voltage at the terminal 51. The sharp cutoff type tube in stage 43 provides a high signal to noise ratio and other advantages at the higher radio frequencies as well as a stabilized reference level for the advantageous introduction of the AGC signal as will be more fully explained. Modulation distortion is avoided by providing in the subsequent remote cutoff stages the major gain reduction and in view of the inherent low signal level in the R. F. stage.

The operation of the circuit of Fig. 2 may be stabilized to prevent variations in gain resulting from fluctuations in circuit voltages and the like by providing a stabilized reference voltage for the control tubes. Thus the current in amplifier 43 is an accurate measure of the AGC potential applied thereto because the reference potential therefor is supplied from ground 23. The effective variation in the potential of the cathode of amplifier 46 is with respect to a stabilized reference voltage on the grid 56 of the proper level derived from the cathode 57 of the audio amplifier 50. In this manner accurately stabilized gain control operation is obtained in a series D. C. circuit arrangement without the addition of any additional component circuits. The reference level for the amplifier 47 is provided by divider circuit 55 which is sufficiently stable for a higher level stage especially in view of the predominant action of the stabilized stages 43 and 44 in establishing the series D. C. current level.

Modifications of the present invention are possible in the light of the above teachings. For example, the number of stages in excess of two connected in series for direct current is a matter of choice and will be governed by other considerations. The control of the current in the sharp cutoff tube by the AGC potential may be arranged in other stages than those shown provided the AGC voltage is applied to the remote cutoff tube in amplified relation. In such applications the presence of a remote cutoff tube in D. C. series relation therewith will provide the improved control characteristic for the amplifier as herein set forth. Further in heterodyne receiver applications the number of series I. F. stages will be a matter of choice. Where stabilization voltage is derived from the audio tube cathode an I. F. stage of a suitable D. C. level will provide the simplest bias stabilization arrangement.

What is claimed is:

1. A gain controlled amplifier comprising: a remote cutoff discharge device having a grid, a cathode and a plate; a sharp cutoff discharge device having a grid, a cathode and a plate; a source of supply current having positive and negative terminals; a circuit serially connecting said devices to said source, including a conductive connection between said plate of said remote cutoff device and said positive terminal, a conductive connection between said cathode of said sharp cutoff device and said negative terminal, and a conductive connection between said cathode of said remote cutoff device and said plate of said sharp cutoff device; signal frequency input and output circuits for each of said devices; signal frequency coupling means between said output circuit of one of said devices and said input circuit of the other of said devices; bias means for said remote cutoff device; and a source of gain controlling potential operatively connected to said input circuit of said sharp cutoff device.

2. A gain controlled amplifier comprising: a remote cutoff discharge device having a grid, a cathode and a plate; a sharp cutoff discharge device having a grid, a cathode and a plate; a source of supply current having positive and negative terminals; a circuit serially connecting said devices to said source, including a conductive connection between said plate of said remote cutoff device and said positive terminal, a conductive connection between said cathode of said sharp cutoff device and said negative terminal, and a conductive connection between said cathode of said remote cutoff device and said plate of said sharp cutoff device; signal frequency input and output circuits for each of said devices; signal frequency coupling means between said output circuit of one of said devices and said input circuit of the other of said devices; bias means for said remote cutoff device; a source of gain controlling potential operatively connected to said input circuit of said sharp cutoff device; and a shunt direct current path including resistance between said positive terminal and said plate of said sharp cutoff device for supplying a portion of the space current thereof.

3. A plural stage gain controlled series amplifier comprising, a source of supply current having positive and negative terminals, a plurality of grid controlled discharge devices having the discharge paths thereof serially connected in conductive polarity across said source to provide a series of stepped voltage operating levels therefor, signal frequency input and output circuits for said devices, means for coupling input frequency signals to one of said input circuits, means for coupling output frequency signals from one of said output circuits, signal frequency interstage coupling means interconnecting the others of said input and output circuits for successive signal frequency transmission through all of said stages, operative bias means for said devices, and means for applying a gain controlling potential to the one of said devices most negative in said series, said last mentioned device being a sharp cutoff device and at least one of the others of said devices being a remote cutoff device.

4. A plural stage gain controlled series amplifier comprising, a source of supply current having positive and negative terminals, a plurality of grid controlled discharge devices having the discharge paths thereof serially connected in conductive polarity across said source to provide a series of stepped voltage operating levels therefor, signal frequency input and output circuits for said devices, means for coupling input frequency signals to one of said input circuits, means for coupling output frequency signals from one of said output circuits, signal frequency interstage coupling means interconnecting the others of said input and output circuits for successive signal frequency transmission through all of said stages, operative bias means for said devices, means for applying a gain controlling potential to the one of said devices most negative in said series, said last mentioned device being a sharp cutoff device and at least one of the others of said devices being a remote cutoff device, and a direct current path including resistance in shunt with the space current path of said remote cutoff tube but not in shunt with the space current path of said sharp cutoff tube.

5. A heterodyne receiver employing discharge device amplifiers for television signals and the like comprising, a source of supply current for said devices, a radio frequency amplifier, an intermediate frequency amplifier and a mixer, means connecting the space current paths of said amplifiers in series for the flow of current from said source, means for providing signal frequency translation progressively through said amplifiers and mixer in normal sequence, means for providing a gain controlling potential to said radio frequency amplifier, and means for providing operative bias to said intermediate frequency amplifier, said discharge devices for said amplifiers being a sharp cutoff type device for said radio frequency amplifier and a remote cutoff type device for said intermediate frequency amplifier.

6. A heterodyne receiver employing discharge device amplifiers for television signals and the like comprising, a source of supply current for said devices, a radio frequency amplifier and a mixer, means connecting the space current paths of said amplifiers in series for the flow of current from said source, means for providing signal frequency translation progressively through said amplifiers and mixer in normal sequence, means for deriving an automatic gain control signal, means for applying said control signal in gain controlling relation to said radio frequency amplifier, and means for providing operative bias to said intermediate frequency amplifier, said discharge devices for said amplifiers being a sharp cutoff type device for said radio frequency amplifier and a remote cutoff type device for said intermediate frequency amplifier.

7. A heterodyne receiver employing discharge device amplifiers for television signals and the like comprising, a source of supply current for said devices, a radio frequency amplifier, an intermediate frequency amplifier and a mixer, means connecting the space current paths of said amplifiers in series for the flow of current from said source, means for providing signal frequency translation progressively through said amplifiers and mixer in normal sequence, means for providing a gain controlling potential to said radio frequency amplifier, means for providing operative bias to said intermediate frequency amplifier, said discharge devices for said amplifiers being a sharp cutoff type device for said radio frequency amplifier and a remote cutoff type device for said intermediate frequency amplifier, and means providing a shunt path including resistance around said remote cutoff device for a portion of the space current of said sharp cutoff device.

8. A heterodyne receiver employing discharge device amplifiers for television signals and the like comprising, a source of supply current for said devices, a radio frequency amplifier, an intermediate frequency amplifier, a mixer, and an audio amplifier, resistance means in the cathode circuit of said audio amplifier, means connecting the space current paths of said radio and intermediate frequency amplifiers in series for the flow of current from said source, means for providing signal frequency translation progressively through the last named amplifiers and said mixer in normal sequence, means for providing a gain controlling potential to said radio frequency amplifier, and means for providing a stabilized bias to said intermediate frequency amplifier from said cathode circuit, said discharge devices for said last named amplifiers being a sharp cutoff type device for said radio frequency amplifier and a remote cutoff type device for said intermediate frequency amplifier.

9. A heterodyne receiver employing discharge device amplifiers for television signals and the like comprising, a source of supply current for said devices, a radio frequency amplifier, an intermediate frequency amplifier, a mixer, and an audio amplifier, resistance means in the cathode circuit of said audio amplifier, means connecting the space current paths of said radio and intermediate frequency amplifiers in series for the flow of current from said source, means for providing signal frequency translation progressively through the last named amplifiers and said mixer in normal sequence, means for providing a gain controlling potential to said radio frequency amplifier, means for providing a stabilized bias to said intermediate frequency amplifier from said cathode circuit, said discharge devices for said last named amplifiers being a sharp cutoff type device for said radio frequency amplifier and a remote cutoff type device for said intermediate frequency amplifier, and means providing a shunt path including resistance around said remote cutoff device for a portion of the space current of said sharp cutoff device.

References Cited in the file of this patent

UNITED STATES PATENTS

| | | |
|---|---|---|
| 2,006,872 | Nyman | July 2, 1935 |
| 2,093,095 | Peterson | Sept. 14, 1937 |
| 2,144,226 | Nyman | Jan. 17, 1939 |
| 2,222,759 | Burnside | Nov. 26, 1940 |
| 2,243,423 | Hollingsworth | May 27, 1941 |
| 2,466,229 | Goldberg | Apr. 5, 1949 |
| 2,545,507 | Williams | Mar. 20, 1951 |
| 2,631,197 | Vilkomerson | Mar. 10, 1953 |